(12) United States Patent
McDonough

(10) Patent No.: US 9,310,019 B2
(45) Date of Patent: Apr. 12, 2016

(54) MULTI-POSITION HOLDER FOR MOBILE ELECTRONIC DEVICE

(71) Applicant: Howard McDonough, Lansing, MI (US)

(72) Inventor: Howard McDonough, Lansing, MI (US)

( * ) Notice: Subject to any disclaimer, the term of this patent is extended or adjusted under 35 U.S.C. 154(b) by 0 days.

(21) Appl. No.: 14/531,244

(22) Filed: Nov. 3, 2014

(65) Prior Publication Data

US 2015/0163932 A1    Jun. 11, 2015

Related U.S. Application Data

(60) Provisional application No. 61/898,597, filed on Nov. 1, 2013.

(51) Int. Cl.
| | | |
|---|---|---|
| *A47B 91/00* | (2006.01) | |
| *F16M 11/04* | (2006.01) | |
| *H05K 5/02* | (2006.01) | |
| *H04M 1/04* | (2006.01) | |

(52) U.S. Cl.
CPC ............... *F16M 11/04* (2013.01); *H04M 1/04* (2013.01); *H05K 5/0204* (2013.01)

(58) Field of Classification Search
CPC ....... H05K 5/0204; H04M 1/04; F16M 11/04; G06F 1/16
USPC ......... 248/346.5, 346.03, 346.01, 188.1, 688; 379/454, 455; 455/575.1
See application file for complete search history.

(56) References Cited

U.S. PATENT DOCUMENTS

| | | | | |
|---|---|---|---|---|
| 5,615,258 | A * | 3/1997 | Ho ...................... | B60R 11/0241 |
| | | | | 379/446 |
| 5,910,074 | A * | 6/1999 | Purdie ................... | A63B 23/12 |
| | | | | 482/141 |
| D668,662 | S * | 10/2012 | Suiter ......................... | D14/447 |
| 8,887,903 | B2 * | 11/2014 | Diebel .......................... | 206/305 |
| 2006/0165230 | A1* | 7/2006 | Parr ........................ | H04M 1/04 |
| | | | | 379/454 |
| 2011/0215214 | A1* | 9/2011 | Grammer ............. | A47B 23/043 |
| | | | | 248/346.5 |
| 2012/0112029 | A1* | 5/2012 | Wong ................. | A63B 69/0022 |
| | | | | 248/346.5 |

* cited by examiner

*Primary Examiner* — Todd M Epps
(74) *Attorney, Agent, or Firm* — The Law Office of Jerry D. Haynes

(57) ABSTRACT

A multi-position holder for a mobile electronic device that includes: a base to provide an elevated platform for the mobile electronic device, where the base includes a top surface; a pair of flanges on each lateral side of the top surface, where each flange enables a screw to penetrate the base and the screw provides a stop for the electronic device; a first support at a first end of the base and said first support extends along a first side of the base, perpendicular to the flanges and rising vertically from the base, where the first support enables the mobile electronic device to rest in a vertical position; and a second support at a second end of the base and said second support opposes the first support, extends along a second side of the base, perpendicular to the flanges and rising vertically from the base, where the second support enables the mobile electronic device to rest in a horizontal position.

4 Claims, 1 Drawing Sheet

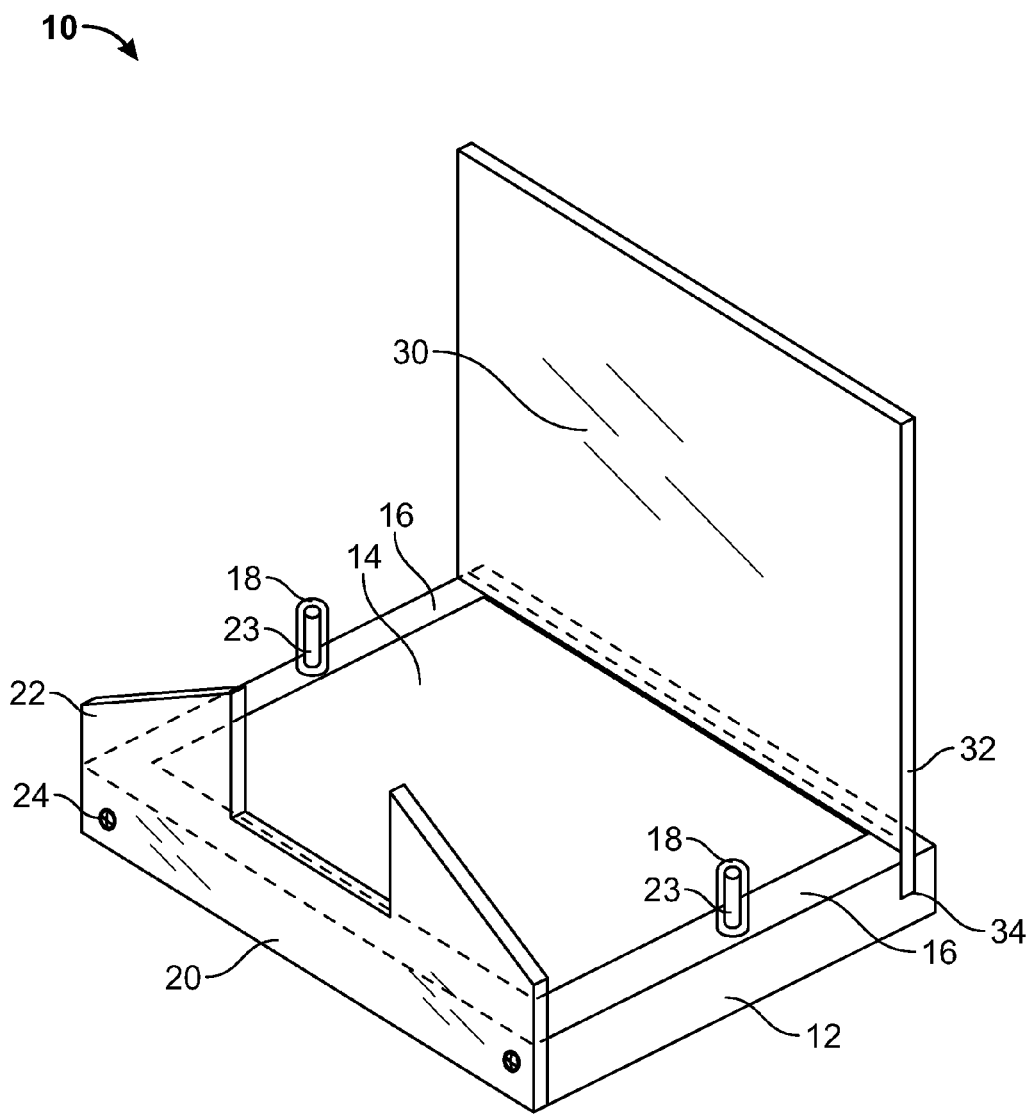

MULTI-POSITION HOLDER FOR MOBILE ELECTRONIC DEVICE

CROSS REFERENCE TO OTHER APPLICATIONS

This application claims priority to U.S. Provisional Application Ser. No. 61/898,597 filed on Nov. 1, 2013.

BACKGROUND OF THE INVENTION

1. Field of the Invention

The present invention relates to a holder for mobile electronic devices which positions the device at various elevated angles thereby allowing a user to more easily control their device.

2. Description of Related Art

People enjoy the convenience of using their mobile electronic devices everywhere. The devices are popular, because of their compact size and ease of use. In this electronic age, people ranging from small toddlers to elderly couples are able to find pleasure with the mobile device, due to the customization that each device provides. The most popular devices are an iPhone®, iPad® and Kindle®, but many other smartphones, tablets and e-readers are available to users. The devices may serve as gaming consoles, video players, GPS devices, e-readers, and web browsers, thereby providing an all in one entertainment system.

Most often when someone wants to use their device single handedly, they must rest the device on a table, desk or other flat surface and their use one of their hand to maneuver through the various screens. This places the mobile device in a flat horizontal position making it difficult to view the screen. If the device slides around too many times, the back surface of the device may develop scratches or gouges damaging its overall appearance. Additionally, liquid spills or food drops on the underlying surface may cause electrical damage to the device which may be irreparable. The safest way to use the device is with both hands but this occupies both hands which is inconvenient to perform any additional tasks.

Therefore it would be beneficial in the art to provide a holder for an electronic device which supports the device at an elevated position above the underlying surface. It would also be desirable in the art to provide a holder for a mobile electronic device, which angles the electronic device for easier viewing of the front screen.

SUMMARY OF THE INVENTION

The present invention relates to a multi-position holder for a mobile electronic device comprising: a base to provide an elevated platform for the mobile electronic device, where the base includes a top surface; a pair of flanges on each lateral side of the top surface, where each flange enables a dowel and vinyl cap to penetrate the base and the dowel and vinyl cap provides a stop for the electronic device; a first support at a first end of the base and said first support extends along a first side of the base, perpendicular to the flanges and rising vertically from the base, where the first support enables the mobile electronic device to rest in a vertical position; and a second support at a second end of the base and said second support opposes the first support, extends along a second side of the base, perpendicular to the flanges and rising vertically from the base, where the second support enables the mobile electronic device to rest in a horizontal position.

BRIEF DESCRIPTION OF THE DRAWINGS

The advantages and features of the present invention will become better understood with reference to the following detailed description and claims taken in conjunction with the accompanying drawing and in which:

FIG. 1 depicts a perspective view of a multi-position holder for a mobile electronic device in accordance with an exemplary embodiment of the present invention.

DETAILED DESCRIPTION OF THE DRAWINGS

The present invention relates to a holder for mobile electronic devices which positions the device at various elevated angles thereby allowing a user to more easily control their device. The invention provides a multi-position holder for a mobile electronic device to allow smartphones and other electronic devices to remain upright, horizontal and vertical while texting, watching videos, playing games, reading and surfing the internet. The multi-position holder includes a base with upright supports front and back to place the electronic device in a horizontal or vertical position. The multi-position holder allows a user to multitask while operating their devices. It also keeps the device at an elevated position to prevent spills and debris from causing damage.

Turning now descriptively to the drawing, referring to FIG. 1, a perspective view of a multi-position holder 10 for an electronic device is shown in accordance with an exemplary embodiment of the present invention. The multi-position holder 10 includes a base 12 which provides an elevated platform for a mobile electronic device. The mobile electronic device may be an iPhone®, iPad®, smartphone, tablet, Kindle®, Nook® or other e-reader. The base 12 may be made from a plastic, wood, aluminum or similar material. The base 12 may include a bottom surface (not shown). The bottom surface may be covered in a felt or rubberized material to prevent scratching to the underlying surface and to prevent the multi-position holder from sliding during use.

The base 12 includes a top surface 14 to support the electronic device and prevent it from sliding. The top surface 14 may be Plexiglass decorated with a logo or picture to provide an aesthetically pleasing appearance. The base 12 may include a pair of flanges 16 on each lateral side of the top surface 14. Each side 16 enables a dowel 23 to penetrate the base 12. A vinyl cap 18 provides a stop for the electronic device to prevent sliding and slipping on the top surface 14 during use.

At a first end of the base 12 may be a first support 20. The first support 20 may extend along an entire face of the base 12, perpendicular to the sides 16, and rise vertically from the base 12. The first support 20 may include a pair of vertical extensions 22 which protrude from each lateral end of the first support 20. Further the sides 16 may include vertical vinyl tipped dowels 23 as shown in FIG. 1. The dowels 23 may provide an additional support means for the electronic device. The vertical extensions 22 may cradle and prevent the electronic device from sliding off the top surface 14 of the base 12. The first support 20 may be fastened to the base 12 with a fastening means. The fastening means may be a set of screws 24 or rivets. The first support 20 may support the electronic device in a vertical position.

At the back end of the base 12 may be a second support 30. The second support 30 opposes the first support 20, and rises vertically in similar fashion as the first support 20. The second support 30 is a piece of Plexiglass that supports the electronic device in a horizontal position. A bottom edge 32 of the second support 30 may insert into a channel 34 within the base 12. The channel 34 allows the second support 30 to be inserted into the base 12.

During use, the user may place their mobile electronic device upon the top surface of the base. Depending on how the user wishes to orient their electronic device they may rest one edge of the device against the top surface and rest the second edge upon the first or second support. This way the mobile electronic device rests at different angles to provide easier viewing and manipulation of the screen. Additionally, the base elevates the electronic device to keep it from any spills or debris on the table, desk or support structure beneath the multi-position holder.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The exemplary embodiment was chosen and described in order to best explain the principles of the invention and its practical application, to thereby enable others skilled in the art to best utilize the invention and various embodiments with various modifications as are suited to the particular use contemplated.

What is claimed is:

1. A multi-position holder for a mobile electronic device comprising:
   a. a base to provide an elevated platform for the mobile electronic device, where the base includes a top surface;
   b. a pair of flanges on each lateral side of the top surface, where each flange enables a dowel to penetrate the base, a vinyl cap covers the dowel and the dowel provides a stop for the electronic device;
   c. a first support at a first end of the base and said first support extends along a first side of the base, perpendicular to the flanges and rising vertically from the base, where the first support enables the mobile electronic device to rest in a vertical position; and
   d. a second support at a second end of the base and said second support opposes the first support, extends along a second side of the base, perpendicular to the flanges and rising vertically from the base, where the second support enables the mobile electronic device to rest in a horizontal position.

2. The multi-position holder according to claim 1, where the top surface is plexiglass.

3. The multi-position holder according to claim 1, where the second support is made of plexiglass.

4. The multi-position holder according to claim 1, where the second support includes a bottom edge that inserts into a channel with the base.

* * * * *